United States Patent [19]

Lack et al.

[11] 4,305,121

[45] Dec. 8, 1981

[54] RECTIFIER APPARATUS WITH IMPROVED HEAT SINK AND DIODE MOUNTING

[75] Inventors: Peter Lack, Schwieberdingen; Stefan Renner, Leonberg, both of Fed. Rep. of Germany

[73] Assignee: Robert Bosch GmbH, Stuttgart, Fed. Rep. of Germany

[21] Appl. No.: 165,558

[22] Filed: Jul. 3, 1980

[30] Foreign Application Priority Data

Aug. 18, 1979 [DE] Fed. Rep. of Germany ....... 2933588

[51] Int. Cl.³ .............................................. H02M 7/06
[52] U.S. Cl. .................................................... 363/141
[58] Field of Search ............. 310/68 D; 363/141, 144, 363/145

[56] References Cited

U.S. PATENT DOCUMENTS 2,221,576  11/1940  Dawson .............................. 363/144
3,573,569  4/1971  Davis et al. ......................... 363/141

FOREIGN PATENT DOCUMENTS 1368478  6/1964  France ................................. 363/145
1501442  10/1967  France ................................. 363/145

*Primary Examiner*—William M. Shoop
*Attorney, Agent, or Firm*—Frishauf, Holtz, Goodman & Woodward

[57] ABSTRACT

In a rectifier in which button diodes are mounted in pairs as columns on bases which also constitute heat sinks, the connector connecting the diodes to the AC phase is made of a material which has high thermal and electrical conductivity. The columns are fastened to the base-heat sink by use of additional heat sink members which in turn are fastened to the base by bolts or screws. The latter are electrically insulating. The base-heat sink is star-shaped, the diode columns being mounted on the rays of the star. Preferably, the additional heat sink members have extensions which increase their effective cooling area.

13 Claims, 7 Drawing Figures

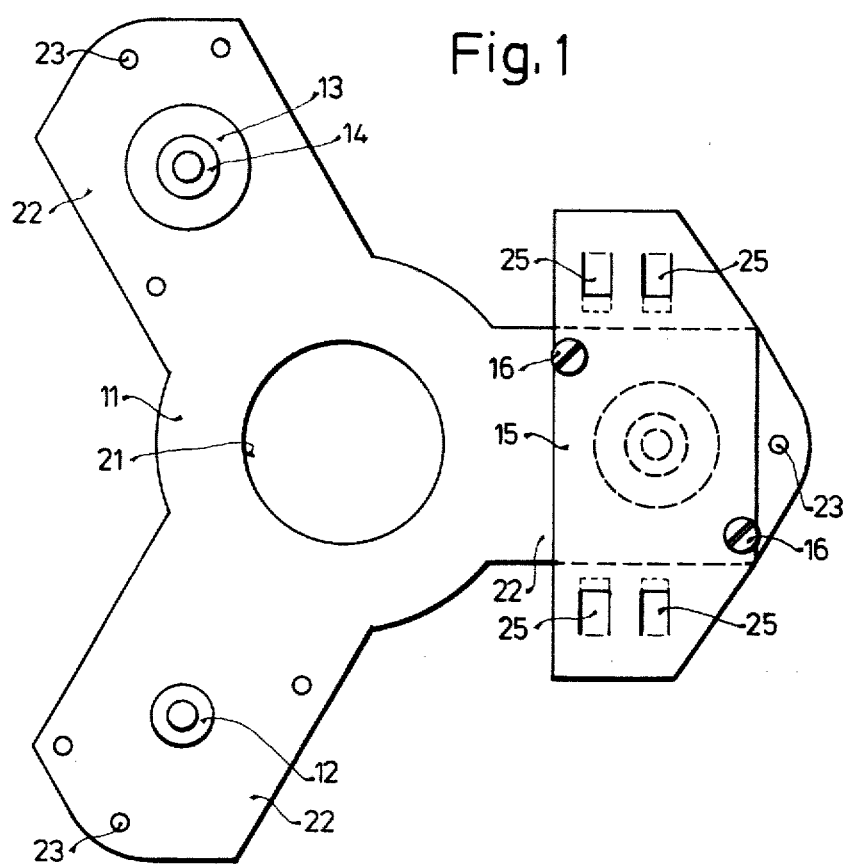
Fig. 1
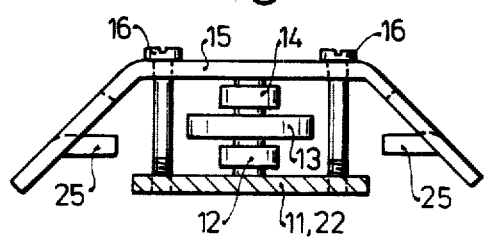
Fig. 2
Fig. 3

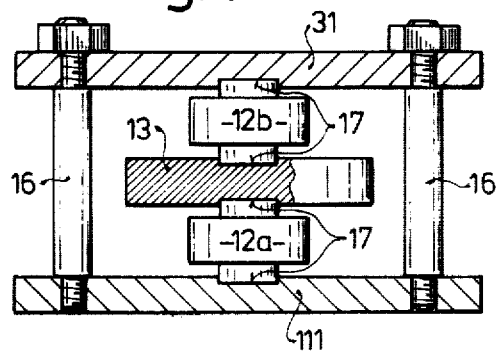
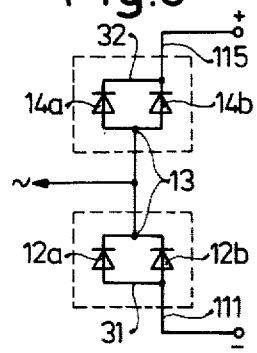
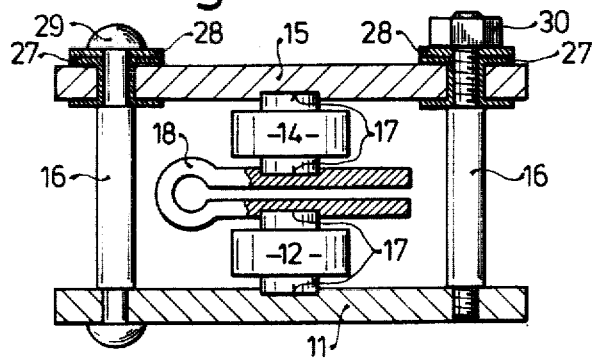
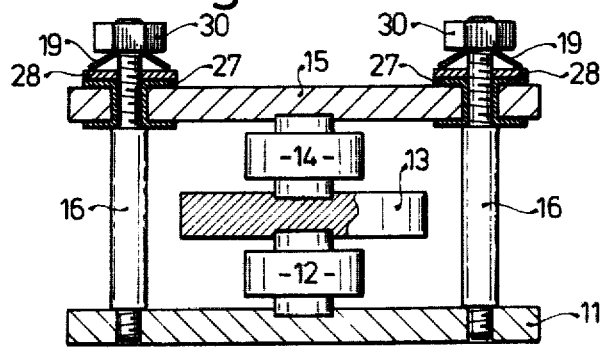

RECTIFIER APPARATUS WITH IMPROVED HEAT SINK AND DIODE MOUNTING

The present invention relates to rectifier apparatus and, more particularly, to rectifier apparatus used in conjunction with the generator in an automotive vehicle.

BACKGROUND AND PRIOR ART

In known rectifier apparatus utilizing button diodes, the diodes are soldered onto the heat sink or braced between heat sinks by compression springs. This type of arrangement has been found unsatisfactory under conditions wherein the apparatus is exposed to a large amount of vibration and/or temperature variations, as is the case in motor vehicles. Further, sufficient cooling often does not take place, particularly for large variations in load.

THE INVENTION

It is an object of the present invention to supply a rectifier arrangement in which the heating loss generated in the diodes is dissipated rapidly and reliably in the heat sinks.

It is a further object of the present invention to provide apparatus in which thermal equilibrium is reached between the individual diodes and, therefore, the electrical characteristics will be equally affected by temperature changes.

It is a further object of the present invention that the diodes will remain reliably mounted even under high vibration and shock.

In known rectifier apparatus, having a positive and negative output terminal, a base is provided which also constitutes a heat sink. Further, first and second diodes are respectively connected to the positive and negative output terminals, the diodes being mounted in pairs as columns. In accordance with the present invention, the phase connectors interposed between the diodes in each of the pairs are made of a material which has high thermal and electrical conductivity.

In a preferred embodiment, the base also constitutes the bearing bracket for the generator. Further, additional heat sink members are punched out of the base, so that little waste occurs during manufacture.

Finally, the mechanical stress, particularly due to temperature variation, on the electrical terminals is decreased by the use of screw or bolt type connections.

DRAWINGS ILLUSTRATING PREFERRED EMBODIMENTS

FIG. 1 is a top-view of a first embodiment of the heat sink of the present invention;

FIG. 2 is a sectional view of a diode column;

FIG. 3 is the electrical circuit diagram;

FIG. 4 is a sectional view through a diode column of a second embodiment of the present invention;

FIG. 5 is the electrical circuit diagram of the apparatus shown in FIG. 4;

FIG. 6 is a sectional view of a diode column of a third embodiment; and

FIG. 7 is a sectional view of a diode column of a fourth embodiment of the present invention.

FIG. 1 shows a star-shaped base 11 which also constitutes a heat sink. It has, at its center, a recess 21 into which, if desired, the bearing for a generator shaft may be inserted. The rays of star-shaped base 11 are denoted by reference numeral 22. At the ends of each ray, appropriate means 23 are provided for fastening base 11 to the generator housing. Diodes 12 are mounted on rays 22. These diodes are to be connected to the negative output terminal of the rectifier apparatus and are herein referred to as second diodes. Copper disks 13 constituting phase connectors are located on top of diodes 12. Diodes 14 to be connected to the positive output terminal, and herein referred to as first diodes, are arranged on the copper disks 13. Diodes 12, copper disks 13 and diodes 14 thus together form a column. Each of the columns 12, 13, and 14 is fastened to base 11 by use of an additional heat sink member 15, which is mechanically coupled to base 11 by means of electrically insulating bolts 16. The additional heat sink members 15 have lug-shaped punched-out extensions 25 which increase the effective cooling surface.

In FIG. 1, for purposes of illustration, the diode arrangements on each of the rays 22 of base 11 is shown in a different state of completion. During manufacture, the columns are, of course, mounted in the completed state on rays 22.

FIG. 2 is a sectional view of one of the columns 12, 13 or 14 which is clamped between base 11 and one of the additional heat sink members 15.

Part of the electric circuit diagram, and, specifically, the electric circuit diagram for one phase of the AC system is shown in FIG. 3. Base 11 constitutes the negative output terminal, copper disk 13 constitutes the phase connector, and the positive output terminal, or connection to the positive side is constituted by the additional heat sink member 15. As illustrated, one of the phases of the stator winding 26 is connected to phase connector 13.

A second embodiment of the present invention is illustrated in FIGS. 4 and 5. This embodiment is particularly preferred for generators having a high output, for example an output current in excess of 80 amperes. For this purpose, two button diodes are always connected in parallel. The particular feature of this embodiment is that two star-shaped heat sinks, 111, 115 are provided. Otherwise, the construction is about the same as that of the first embodiment. Specifically, a diode 12a is mounted on base 111, its anode abutting and electrically connected to the latter. Then follows the phase connector, namely copper disk 13 and mounted thereon is a further second diode 12b whose cathode faces phase connector 13, as does the cathode of diode 12a. The anode of diode 12b abuts a heat sink member 31. The latter is tightly coupled to base 111 both in mechanical, thermal and electrical respects. Thus the two diodes 12a and 12b which are connected electrically in parallel will have substantially the same characteristic curves even for large temperature variations. For increased mechanical stability, base 111, heat sink member 31 and copper disk 13 have recesses 17 for receiving the connections to diodes 12a and 12b.

FIG. 5 is the electrical circuit diagram associated with the embodiment shown in FIG. 4.

It will be noted that a base-heat sink 115, connected to the positive output terminal, is not shown in FIG. 4. This second base has the same shape as the previously described base 11. The only difference is that the diodes 14a and 14b have their cathodes connected to the base, rather than the anodes as was the case with diodes 12a and 12b. The completed rectifier apparatus then consists of two base-heat sinks 111, 112 which, preferably, are rotated by 60° relative to one another within the generator. The rays 22 of base 111 are then located opposite the space between the rays of base 115.

Two variations of a third embodiment are shown in FIGS. 6 and 7. Here, apparatus is provided for equalizing the thermal stresses in the equipment. The construction is substantially the same as that in the first and second embodiment and the same reference numerals are used for the corresponding elements. Bolts 16 are insulated relative to heat sink member 15 by means of an insulating element 27. Insulating element 27 is mechanically protected by a washer 28. The head of bolt 16 is constituted either by a rivet 29 or a nut 30.

In FIG. 6, copper disk 13 is replaced by a U-shaped compression spring 18 which also constitutes the phase connecting member.

In the variation according to FIG. 7, a spring 19 is inserted between nut 30 and washer 28.

Preferably, the additional heat sink members 15, 31, and 32 are punched out of the material between the rays 22 of base-heat sinks 11, 111, and 115.

Various changes and modifications may be made within the scope of the inventive concepts.

We claim:

1. In rectifier apparatus comprising a positive and negative output terminal, a base also constituting a heat sink, and first and second diodes respectively connected to said positive and negative output terminals and mounted in pairs as columns, the improvement comprising
    phase connectors having high thermal and electrical conductivity interposed between said diodes in each of said pairs;
    additional heat sink members (15; 31; 32) for fastening said diode columns (12; 14; 12a; 12b; 14a; 14b) to said base (11; 111; 115); and
    a plurality of electrically insulating members for fastening said additional heat sink members to said base.

2. Rectifier apparatus as set forth in claim 1, wherein said electrically insulating members are bolts (16).

3. Rectifier apparatus as set forth in claim 1, wherein the AC voltage to be rectified is furnished by a generator requiring a bearing plate; and
    wherein said base also constitutes said bearing plate of said generator.

4. Rectifier apparatus as set forth in claim 1, wherein said base is star-shaped; and
    wherein said diodes are mounted on the rays (22) of said star.

5. Rectifier apparatus as set forth in claim 4, wherein said further heat sink members are punched out of the material from the space between said rays.

6. Rectifier apparatus as set forth in claim 1, wherein at least a selected one of the group constituted by said base, said phase connectors and said additional heat sink members has a recess (17) for receiving said diodes.

7. Rectifier apparatus as set forth in claim 6, wherein each of said diodes has a predetermined thickness and diameter; and
    wherein said recess has a depth less than said predetermined thickness and a diameter substantially equal to said diameter of said diodes.

8. Rectifier apparatus as set forth in claim 2, wherein each of said bolts has a bolt head (29, 30); further comprising disk-shaped springs, each for bracing one of said additional heat sink members relative to the associated one of said bolt heads.

9. Rectifier apparatus as set forth in claim 1, wherein each of said phase connectors is a U-shaped compression spring.

10. Rectifier apparatus as set forth in claim 1, wherein each of said additional heat sink members has punched-out extensions (25) for increasing the effect of cooling surface.

11. In rectifier apparatus comprising a positive and negative output terminal, a first base also constituting a heat sink, and first and second diodes respectively connected to said positive and negative output terminals and mounted in pairs as columns, the improvement comprising
    phase connectors having high thermal and electrical conductivity interposed between said diodes in each of said pairs;
    additional heat sink members (15; 31; 32) for fastening said diode columns (12; 14; 12a, 12b; 14a, 14b) to said first base;
    a second base also constituting a heat sink; and
    wherein said first and second diodes are mounted on said second and first base, respectively.

12. Rectifier apparatus as set forth in claim 11, further comprising means for mechanically, thermally, and electrically connecting each of said additional heat sink members to the associated one of said bases.

13. Rectifier apparatus as set forth in claim 12, wherein said first and second bases are arranged one over the other in the axial direction thereof, and in such a manner that the rays (22) of the one are opposite the space between the rays of the other.

* * * * *